United States Patent
Joubran et al.

(10) Patent No.: US 12,352,158 B2
(45) Date of Patent: Jul. 8, 2025

(54) DOWNHOLE FAULT DETECTION IN WELL SYSTEM USING SPREAD SPECTRUM TIME DOMAIN REFLECTOMETRY (SSTDR)

(71) Applicant: Halliburton Energy Services, Inc., Houston, TX (US)

(72) Inventors: Jonathon N. Joubran, Spring, TX (US); Glen P. Breerwood, Spring, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 84 days.

(21) Appl. No.: 18/325,811

(22) Filed: May 30, 2023

(65) Prior Publication Data
US 2024/0401473 A1 Dec. 5, 2024

(51) Int. Cl.
*E21B 47/13* (2012.01)
*G01R 27/06* (2006.01)
(Continued)

(52) U.S. Cl.
CPC .............. *E21B 47/13* (2020.05); *G01R 27/06* (2013.01); *G01R 31/083* (2013.01); *G01R 31/2879* (2013.01)

(58) Field of Classification Search
CPC ........ E21B 47/12; E21B 47/125; E21B 47/13; E21B 47/135; G01R 27/06; G01R 31/08;
(Continued)

(56) References Cited

U.S. PATENT DOCUMENTS

| 8,174,403 B2 * | 5/2012 | Kamata ................ G01V 11/002 |
| | | 73/152.43 |
| 9,244,117 B2 * | 1/2016 | Furse ................. G01R 31/2841 |
| (Continued) | | |

FOREIGN PATENT DOCUMENTS

| CN | 103605049 | 2/2014 |
| CN | 11273129 | 6/2020 |
| (Continued) | | |

OTHER PUBLICATIONS

"PCT Application No. PCT/US2023/067720, International Search Report and Written Opinion", Feb. 22, 2024, 10 pages.

*Primary Examiner* — Franklin D Balseca
(74) *Attorney, Agent, or Firm* — DeLizio, Peacock, Lewin & Guerra, LLP (57) ABSTRACT

Systems, methods, and apparatus, including computer programs encoded on computer-readable media, for downhole fault detection in a well system are disclosed. A spread spectrum time domain reflectometry (SSTDR) apparatus of the well system may transmit an SSTDR signal downhole via a well electrical cable of the well system and receive a reflected SSTDR signal. The SSTDR apparatus may determine whether a downhole fault exists in the well electrical cable or in a well device based on a signal analysis of the reflected SSTDR signal and the transmitted SSTDR signal. The SSTDR apparatus may also use historical SSTDR data and a machine learning algorithm for downhole fault detection and analysis. When a downhole fault is detected, the SSTDR apparatus also may determine a type of the downhole fault and a location of the downhole fault, such as the depth downhole of the downhole fault.

14 Claims, 6 Drawing Sheets

(51) Int. Cl.
*G01R 31/08* (2020.01)
*G01R 31/28* (2006.01)

(58) Field of Classification Search
CPC .. G01R 31/081; G01R 31/083; G01R 31/085; G01R 31/086; G01R 31/11; G01R 31/2879
See application file for complete search history.

(56) References Cited

U.S. PATENT DOCUMENTS

| | | | |
|---|---|---|---|
| 9,476,932 B2 | 10/2016 | Furse et al. | |
| 10,267,841 B2 | 4/2019 | Simpson | |
| 10,338,124 B2* | 7/2019 | Jeon | G01R 31/58 |
| 10,513,920 B2* | 12/2019 | Salminen | E21B 7/00 |
| 11,762,007 B2* | 9/2023 | Shin | G06T 7/64 |
| | | | 702/59 |
| 11,815,560 B2* | 11/2023 | Shier | G01R 31/54 |
| 2005/0046591 A1* | 3/2005 | Pacault | E21B 17/0283 |
| | | | 340/855.2 |
| 2021/0247463 A1 | 8/2021 | Shier | |

FOREIGN PATENT DOCUMENTS

| | | |
|---|---|---|
| EP | 2909643 | 8/2015 |
| EP | 2339359 | 9/2020 |

* cited by examiner

DOWNHOLE FAULT DETECTION IN WELL SYSTEM USING SPREAD SPECTRUM TIME DOMAIN REFLECTOMETRY (SSTDR)

TECHNICAL FIELD

The present invention relates generally to energy services, and more specifically to downhole fault detection in an electrical cable of a well system using spread spectrum time domain reflectometry (SSTDR).

BACKGROUND

In well systems, faults can occur downhole in the well electrical cable or the well devices connected to the well electrical cable. The downhole faults can cause a reduction of productivity in hydrocarbon exploration and recovery operations, or in some cases, a delay or halt of the hydrocarbon exploration and recovery operations. Time Domain Reflectometry (TDR) is sometimes used in the oil and gas industry for downhole fault detection in well electrical cables. However, TDR traces are often difficult to interpret and do not give accurate results of the location of the faults. Furthermore, TDR traces typically cannot be performed on a live cable because other signals can impact the TDR results, and thus the well systems are usually powered down to perform the TDR test. Powering down well systems is costly and results in unnecessary delays.

DESCRIPTION

The description that follows includes example systems, methods, techniques, and program flows that describe aspects of the disclosure. However, it is understood that this disclosure may be practiced without these specific details. For instance, this disclosure refers to reservoir modeling in illustrative examples. Aspects of this disclosure can be instead applied to other types of models involving spatiotemporal datasets. In other instances, well-known instruction instances, protocols, structures, and techniques have not been shown in detail to avoid confusion.

Time Domain Reflectometry (TDR) can be used in the oil and gas industry for downhole fault detection in well systems. However, TDR results are not accurate because they typically can only pinpoint the location of the downhole fault to an area of a few hundred feet. There may be various cable lines, downhole connectors and well devices within an area of a few hundred feet. Furthermore, TDR techniques for downhole fault detection typically cannot be performed on a live well system because other signals can impact the TDR results. Various innovative aspects of the subject matter described in this disclosure for downhole fault detection in well systems using spread spectrum time domain reflectometry (SSTDR). An SSTDR apparatus of a well system may transmit an SSTDR signal downhole via a well electrical cable of the well system and receive a reflected SSTDR signal. The SSTDR apparatus may determine whether a downhole fault exists in the well electrical cable (such as a cable line or connector) or in a well device (such as a gauge or sensor) based on a signal analysis of the reflected SSTDR signal and the transmitted SSTDR signal, as further described herein. When a downhole fault is detected, the SSTDR apparatus also may determine a type of the downhole fault and a location of the downhole fault, such as the depth downhole of the downhole fault. Downhole fault detection in well systems using SSTDR can pinpoint faults within a few centimeters or a fraction of an inch. Also, SSTDR fault detection techniques can be performed on live well systems.

Figure 1:
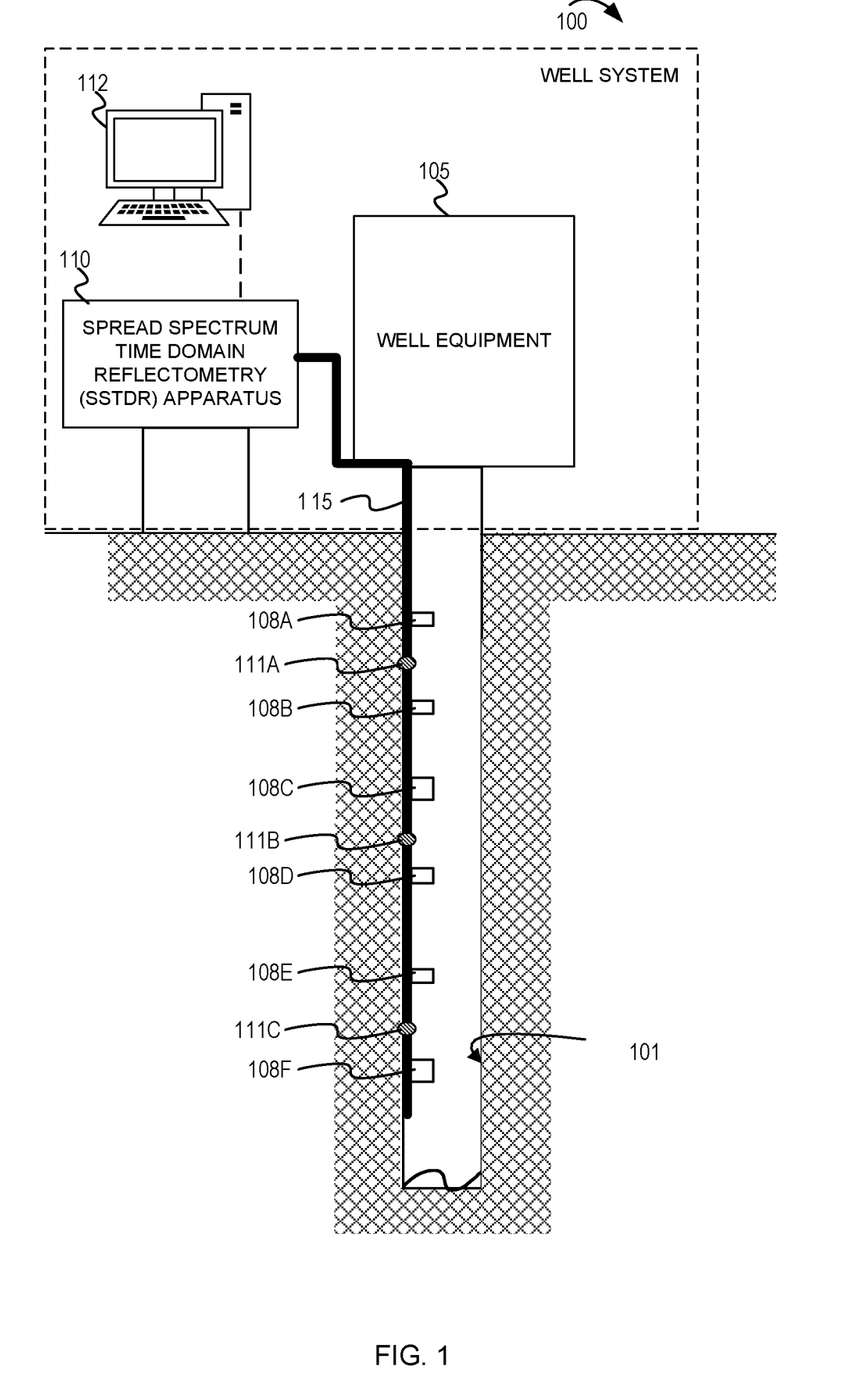
FIG. 1 depicts an example diagram of a well system including a spread spectrum time domain reflectometry (SSTDR) apparatus for detecting downhole faults in a well electrical cable, according to some implementations.

FIG. 1 depicts an example diagram of a well system 100 including a spread spectrum time domain reflectometry (SSTDR) apparatus 110 for detecting downhole faults in a well electrical cable 115. The SSTDR apparatus 110, the well electrical cable 115, the wellbore 101, and well equipment 105 may be used for various types of well systems for hydrocarbon (such as oil and gas) exploration and recovery. One type of well system 100 may be a drilling rig system having well equipment 105 that is used for drilling, exploration, and production operations, which is further described in FIG. 5. Another type of well system 100 may be a fracturing system having well equipment 105 that is used for fracturing operations, as shown in FIG. 6. The well system 100 may use the SSTDR apparatus 110 for downhole fault detection in the well electrical cable 115. FIG. 1 shows one example implementation of the SSTDR apparatus 110 being connected to a computer system 112. In some implementations, the SSTDR apparatus 110 may be implemented as standalone apparatus, or may be implemented or installed within the computer system 112.

As shown in FIG. 1, the well electrical cable 115 is placed downhole in the wellbore 101 and connected to the SSTDR apparatus 110. Multiple well devices, such as well devices 108A-F (which may generally be referred to as well devices 108), may be connected to the well electrical cable 115. The well electrical cable 115 may provide power and communication capabilities to the multiple well devices 108A-F. The well devices 108A-F may include any types of downhole devices used in well systems, such as various types of downhole gauges, various types of downhole sensors, various types of downhole actuators, various types of downhole mandrels, and various types of downhole valves, among others. The well electrical cable 115 also may include multiple connectors or connection points, such as downhole connectors 111A-C (which generally be referred to as downhole connectors 111), which form the well electrical cable 115 and may be considered part of the overall well electrical cable 115. The downhole connectors 111A-C may be used to connect well devices (such as well devices 108A-F) to the well electrical cable, or may be used to add additional cable lines or cable branches to the well electrical cable 115. The connectors 111A-C may be various types of downhole electrical connectors, such as temperature and pressure resistant connectors and wet-mate connectors. The well electrical cable 115 also may include various cable lines, cable wires, cable branches, and various sections of the well electrical cable 115 that are not shown in FIG. 1 for simplicity. It is noted that FIG. 1 shows an example well electrical cable 115 of the well system 100, and in other examples well systems may have well electrical cables having fewer or more well devices and at different locations within the wellbore 101. It is also noted that FIG. 1 shows an example well electrical cable 115 with a few downhole connectors for simplicity, and in other examples well systems may have various other connectors in multiple cable branches and at different locations within the wellbore 101.

In some implementations, the SSTDR apparatus 110 may implement SSTDR to detect downhole faults in the well electrical cable 115 including any faults in the cable lines, connectors (such as well connectors 111), and well devices (such as well devices 108). The SSTDR apparatus 110 may use SSTDR to detect the type of downhole fault and the location of the downhole fault. For example, the types of downhole faults may include open circuits, short circuits, and other types of anomalies further described below. The location of a downhole fault may be, for example, a location on the well electrical cable 115 at a certain depth downhole. SSTDR may be able to monitor and locate real-time changes in live electrical wires and circuits that can indicate faults, and thus can be used to detect downhole faults in well electrical cables (such as well electrical cable 115) of well systems (such as well system 100). SSTDR can be used on live electrical systems with minimal interference with signals already present in the system and external electrical noise sources because SSTDR signals have natural noise immunity. SSTDR signals also have a dynamic frequency domain bandwidth that can be varied by the modulation frequency. Since SSTDR can be implemented in live electrical wires, the SSTDR apparatus 110 may be configured to continuously or periodically monitor the well electrical cable 115 for downhole faults.

Figure 2A:
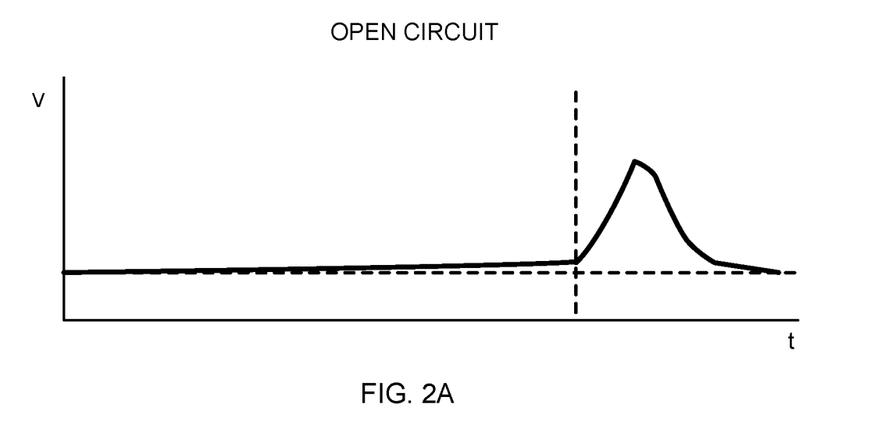
FIG. 2A and FIG. 2B are example SSTDR traces that assist in detecting downhole faults, according to some implementations.
Figure 2B:
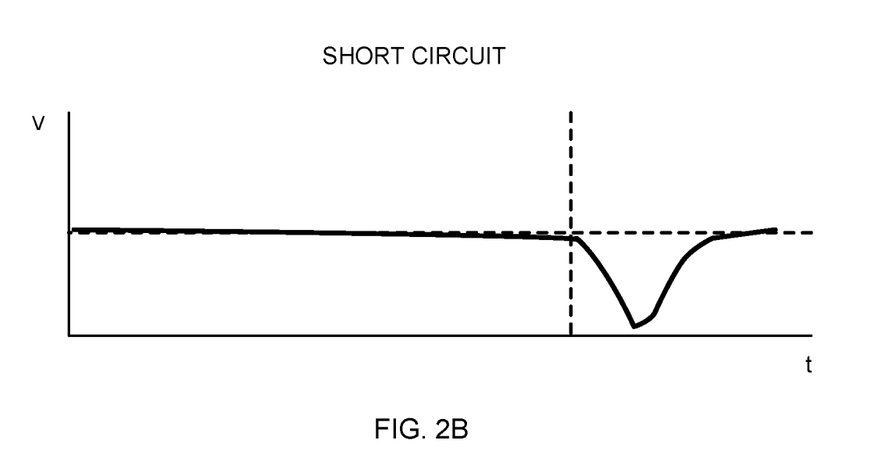

In some implementations, in order to detect the type and location of a downhole fault, the SSTDR apparatus 110 may transmit one or more SSTDR signals downhole via the well electrical cable 115. The SSTDR apparatus 110 may receive one or more reflected SSTDR signals that are associated with the transmitted SSTDR signals. The SSTDR apparatus 110 may correlate the reflected SSTDR signals with the transmitted SSTDR signals. The SSTDR apparatus 110 may apply one or more signal processing or signal analysis algorithms (such as spread spectrum signal analysis algorithms) to both the shape and the timing of the signals to detect the location and type of downhole fault (such as short circuit or open circuit). Traditional TDR trace results are typically not accurate or reliable because they detect the location of a fault within a few hundred feet, and the cable may have multiple cable lines, connectors, and devices within a few hundred feet. SSTDR trace results may accurately detect the type of fault within a few centimeters or within a fraction of an inch. For example, an SSTDR trace may have a shape, such as the shape shown in FIG. 2A, that indicates the downhole fault is an open circuit, and the timing and other signal analysis may indicate the downhole fault is at a depth of 7,581 feet (accuracy within a fraction of an inch). As another example, an SSTDR trace may have a shape, such as the shape shown in FIG. 2B, that indicates the downhole fault is a short circuit, and the timing and other signal analysis may indicate the downhole fault is at a depth of 5,031 feet (accuracy within a fraction of an inch). It is noted that the signal shapes shown in FIGS. 2A and 2B are just examples and the SSTDR apparatus 110 may look for various other types of signal shapes or signal signatures, including more complex spread spectrum signal signatures, to detect a downhole fault and determine the type of downhole fault. Since the SSTDR can accurately locate the downhole fault within a few centimeters or a fraction of an inch, the SSTDR apparatus 110 can accurately pinpoint whether the downhole fault is in a certain part of the cable line at the identified depth or at a certain connector or well device that is located at the identified depth. For instance, in the examples described above, a well connector may be located at approximately 5,031 feet and a well device may be located at approximately 7,581 feet.

The downhole faults (such as short circuits or open circuits) that are detected in a well device 108, downhole connector 111 or cable line may be due to various reasons. For example, there may be a break in the cable line or connector, a faulty cable branch or connector, a break or weakness in a tubing case conductor, a faulty device, a disconnected device, or various other downhole faults. When the downhole fault is detected in one of the well devices 108, one of the components within the well device 108 may be faulty. In some implementations, in addition to being able to detect a faulty well device at a particular location downhole, the SSTDR apparatus 110 may implement SSTDR to assist in detecting which component (or components) of the multiple components within the well device is faulty. SSTDR may be used to assist in detecting downhole faults in both well devices (such as well devices 108) and components within the well devices. For example, well devices 108 may include capacitors, diodes, resistors, solder connections, and various other types of internal connectors and internal components that can fail or be installed incorrectly. In some implementations, the reflected SSTDR signals can have certain signal signatures that can identify which component has failed within a faulty well device. For example, as described below, machine learning algorithms and signal processing techniques can be used to identify both a faulty well device and a faulty component within the faulty well device.

In some implementations, the SSTDR apparatus 110 may implement machine learning algorithms and signal processing techniques (such as spread spectrum signal processing techniques) to assist in detecting downhole fault in the well electrical cable 115, including faults in cable lines, downhole connectors 111, well devices 108, and components within well devices 108. For example, the SSTDR apparatus 110 may implement machine learning and spread spectrum signal processing and analysis techniques to assist in detecting and analyzing certain signal signatures in the reflected SSTDR signals that indicate at least one of the type of fault, the type of well device that is faulty, or the component within a well device that is faulty. As another example, the machine learning algorithm may process and analyze data from SSTDR traces, data from other measurement and troubleshooting techniques, and historical SSTDR data and other historical troubleshooting data to detect the downhole faults. In some implementations, machine learning and spread spectrum signal processing techniques may include obtaining and analyzing various different SSTDR traces from different SSTDR settings, including transmitting SSTDR signals at different signal strengths, different spectrum settings, or different signal types, among other settings. In some implementations, the SSTDR apparatus 110 may apply machine learning and signal processing techniques to analyze real-time and historical data from one or more cables or conductors from the same well system (such as well system 100) and from various other well systems located locally or remotely. For example, the SSTDR apparatus 110 or the computer system 112 can connect to a cloud computer network or a remote servers that store historical SSTDR results from other local or remote well systems. The machine learning and spread spectrum signal processing and analysis techniques that utilize SSTDR trace results, historical data, and data from other measurement and troubleshooting techniques may allow detection of various types of downhole faults (in addition to short circuits and open circuits) and anomalies, such as circuit impedance changes, intermittent and persistent faults, reverse polarity, arc faults, and predict potential downhole faults, among others.

After identifying the location and the type of fault, the SSTDR apparatus 110 can determine which section or sections of the well electrical cable 115, which downhole connectors 11, or which well devices 108 are failing most often. The SSTDR apparatus 110 can analyze trends in the downhole faults, predict potential future faults, and identify other patterns, such as by using machine learning algorithms. Operators of the well system 100 can determine to remove certain connectors or well devices from the well system, find alternate connectors or well devices or cables, or try to design around the connectors or well devices in future well systems. In some instances, operators can remove and replace or fix the faulty cable section, faulty downhole connector, or faulty well device. Operators can improve training of well system personnel or improve manufacturing processes of the faulty cables, connectors or devices based on the results.

Figure 3:
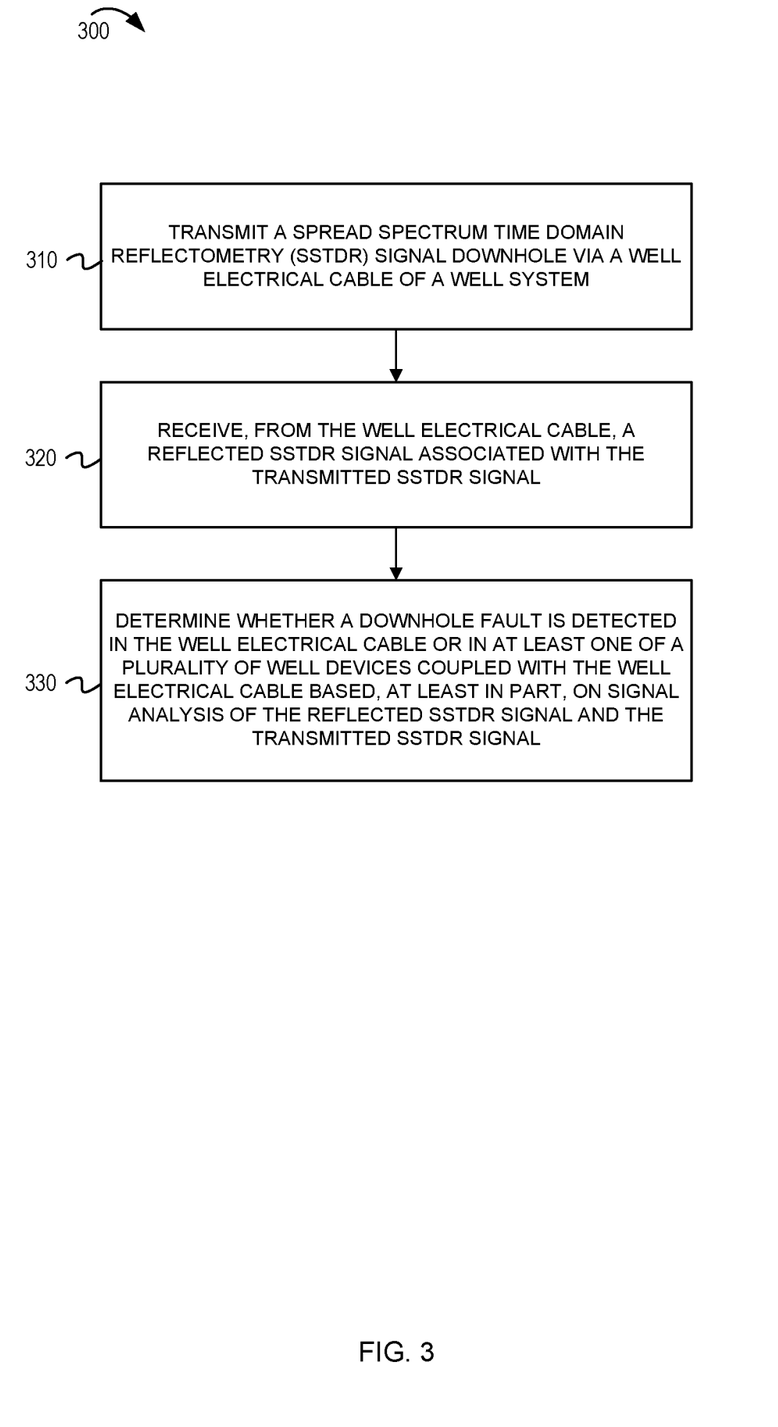
FIG. 3 is a flowchart of example operations for downhole fault detection in a well system, according to some implementations.

FIG. 3 is a flowchart of example operations for downhole fault detection in a well system. The operations may include transmitting an SSTDR signal downhole via a well electrical cable of the well system (block 310). The operations may include receiving, from the well electrical cable, a reflected SSTDR signal associated with the transmitted SSTDR signal (block 320). The operations may include determining whether a downhole fault is detected in the well electrical cable or in at least one of a plurality of well devices coupled with the well electrical cable based, at least in part, on a signal analysis of the reflected SSTDR signal and the transmitted SSTDR signal (block 330).

In some implementations, in response to a detection of a downhole fault in the well electrical cable or in at least one of the plurality of well devices, the operations may include determining a location of the downhole fault and a type of the downhole fault, where the location of the downhole fault may include a depth downhole of the downhole fault. In some implementations, the well electrical cable includes cable lines and downhole connectors, and the operations may include determining whether the downhole fault is in a section of the cable lines, in at least one of the downhole connectors, or in at least one of the plurality of devices based, at least in part, on the depth downhole of the downhole fault and the type of the downhole fault.

In some implementations, the operations may include performing spread spectrum signal analysis on the reflected SSTDR signal and the transmitted SSTDR signal to determine real-time SSTDR data for the well system, accessing historical SSTDR data for the well system, accessing historical SSTDR data for one or more additional well systems, and determining whether a downhole fault is detected based, at least in part, on the real-time SSTDR data for the well system, the historical SSTDR data for the well system, and the historical SSTDR data for one or more additional well systems. In some implementations, the operations may include detecting a downhole fault in a first well device of the plurality of well devices based, at least in part, on a depth downhole of the downhole fault and a type of the downhole fault, and determining which component of a plurality of components of the first well device is faulty based, at least in part, on the type of the downhole fault and one or more signal signatures detected in at least the reflected SSTDR signal.

Figure 4:
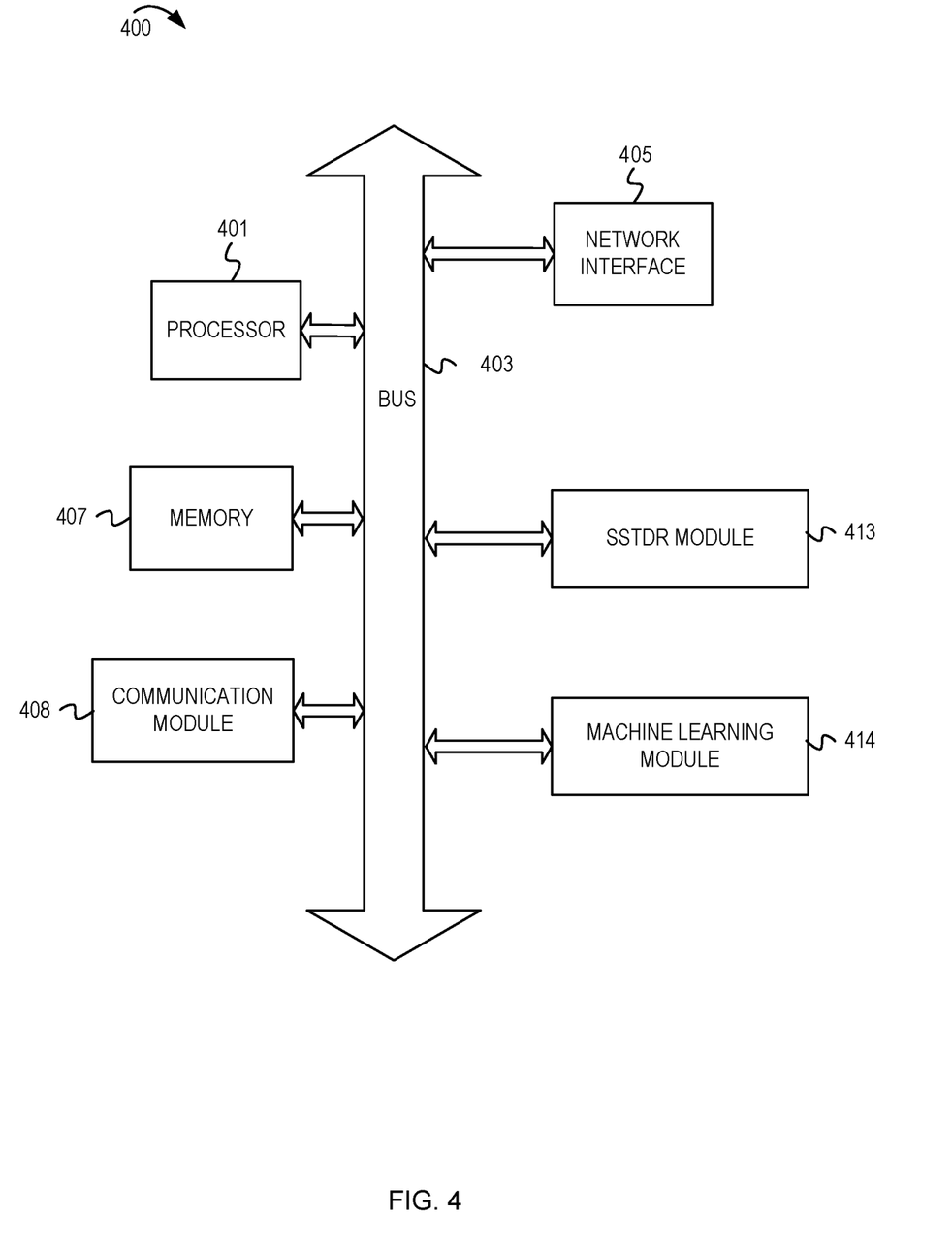
FIG. 4 depicts an example computer system configured to implement SSTDR to detect downhole faults in a well system, according to some implementations.

FIG. 4 depicts an example computer system configured to implement SSTDR to detect downhole faults in a well system. In some implementations, the computer system 400 may be an example of the SSTDR apparatus 110 shown in FIG. 1. In some implementations, the computer system 400 may be an example of the computer system 112 shown in FIG. 1 that implements the functionality of the SSTDR apparatus 110 or has the SSTDR apparatus 110 installed within the computer system 112, or works in conjunction with the SSTDR apparatus 110 to implement the SSTDR operations. The computer system 400 may include one or more processors 401 (possibly including multiple cores, multiple nodes, and/or implementing multi-threading, etc.). The computer system 400 may include memory 407. The memory 407 may be system memory or any type or implementation of machine or computer readable media having instructions that are executed by the one or more processors 401 to implement the operations described in FIG. 1. The computer system 400 also may include a bus 403 and a network interface 405. The computer system 400 also may include a communications module 408 that may control wired and wireless communications, such as receiving sensor data from sensors installed in well equipment and transmitting control information to control well equipment or well devices. The computer system 400 also may include at least an SSTDR module 413 and a machine learning module 414, among other processing modules that perform operations described in FIG. 1. For example, the SSTDR module 413 may implement SSTDR for downhole fault detection, as described in FIG. 1. The machine learning module 414 may implement machine learning techniques and work in conjunction with the SSTDR module 413 to detect and analyze SSTDR traces and other SSTDR data in order to detect the type and location of downhole faults, as described in FIG. 1. The functionality described herein may be implemented with an application-specific integrated circuit, in logic implemented in the one or more processors 401, in a co-processor on a peripheral device or card, etc. Further, implementations may include fewer or additional components not illustrated in FIG. 4 (e.g., video cards, audio cards, additional network interfaces, peripheral devices, etc.). The one or more processors 401 and the network interface 405 may be coupled to the bus 403. Although illustrated as being coupled to the bus 403, the memory 407 may be coupled to the one or more processors 401.

Figure 5:
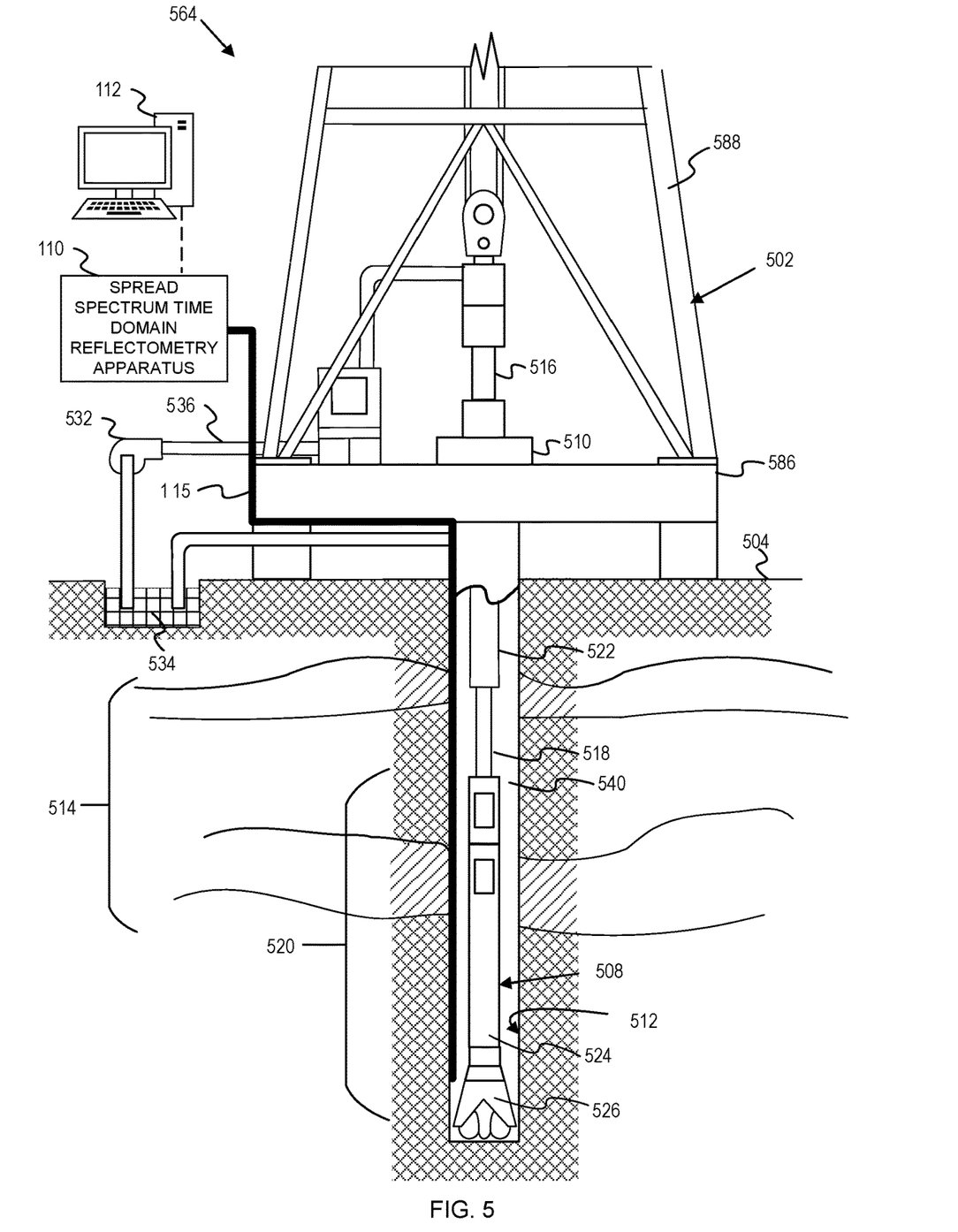
FIG. 5 is a schematic diagram of a drilling rig system, as an example of oil services systems that use surface and downhole equipment, according to some implementations.
Figure 6:
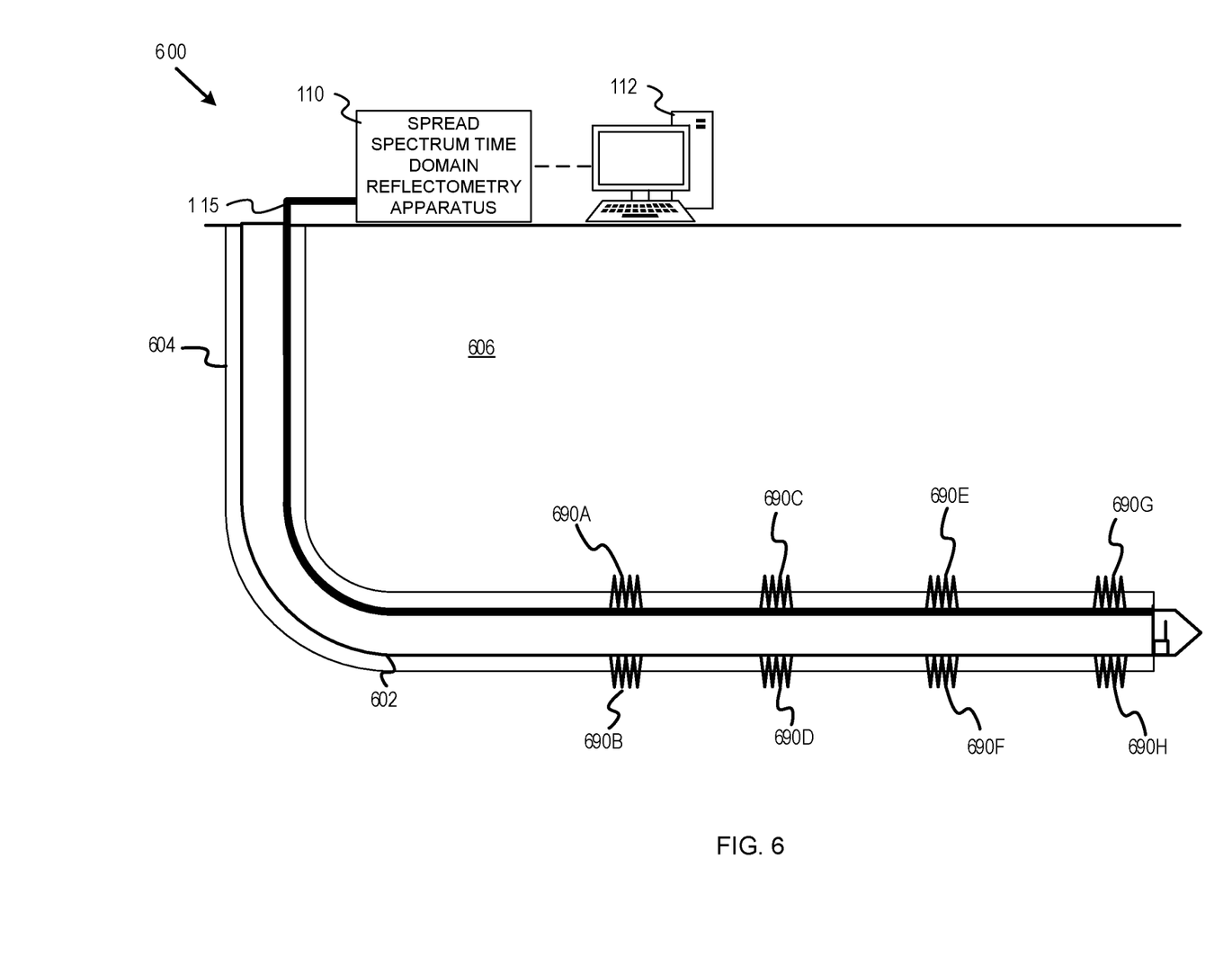
FIG. 6 is a schematic diagram of an example well system that includes fracturing operations, according to some implementations.

FIG. 5 is a schematic diagram of a drilling rig system, as an example of oil services systems that use surface and downhole equipment. For example, in FIG. 5 it can be seen how a system 564 may also form a portion of a drilling rig 502 located at the surface 504 of a well. Drilling of oil and gas wells is commonly carried out using a string of drill pipes connected together so as to form a drilling string 508 that may be lowered through a rotary table 510 into a wellbore or borehole 512. Here a drilling platform 586 may be equipped with a derrick 588 that supports a hoist. A computer system 112 may be communicatively coupled to the surface and downhole equipment including the SSTDR apparatus 110 shown in FIG. 1 that may be used for downhole fault detection. The computer system 112 may include memory (machine or computer readable media) and one or more processors, as described in FIG. 4. A well electrical cable 115 may be coupled to the SSTDR apparatus 110 similarly as described above with reference to FIG. 1. Similar to FIG. 1, the well electrical cable 115 may include cable lines, downhole connectors, and well devices. The well electrical cable 115 may provide power and communication capabilities to the well devices. As described in FIG. 1, the SSTDR apparatus 110 may perform SSTDR operations to detect downhole faults in the cable lines, downhole connectors, or the well devices.

The drilling rig 502 may provide support for the drill string 508. The drill string 508 may operate to penetrate the rotary table 510 for drilling the borehole 512 through subsurface formations 514. The drill string 508 may include a Kelly 516, drill pipe 518, and a bottom hole assembly 520, perhaps located at the lower portion of the drill pipe 518.

The bottom hole assembly 520 may include drill collars 522, a downhole equipment or tool 524, and a drill bit 526. The drill bit 526 may operate to create a borehole 512 by penetrating the surface 504 and subsurface formations 514. The downhole equipment or tool 524 may comprise any of a number of different types of tools including MWD tools, LWD tools, and others.

During drilling operations, the drill string 508 (perhaps including the Kelly 516, the drill pipe 518, and the bottom hole assembly 520) may be rotated by the rotary table 510. In addition to, or alternatively, the bottom hole assembly 520 may also be rotated by a motor (e.g., a mud motor) that may be located downhole. The drill collars 522 may be used to add weight to the drill bit 526. The drill collars 522 may also operate to stiffen the bottom hole assembly 520, allowing the bottom hole assembly 520 to transfer the added weight to the drill bit 526, and in turn, to assist the drill bit 526 in penetrating the surface 504 and subsurface formations 514.

Drilling operations may utilize various surface equipment, such as a mud pump 532 or other types of surface or downhole equipment. During drilling operations, the mud pump 532 may pump drilling fluid (sometimes known by those of ordinary skill in the art as "drilling mud") from a mud pit 534 through a hose 536 into the drill pipe 518 and down to the drill bit 526. The drilling fluid may flow out from the drill bit 526 and be returned to the surface 504 through an annular area 540 between the drill pipe 518 and the sides of the borehole 512. The drilling fluid may then be returned to the mud pit 534, where such fluid may be filtered. In some implementations, the drilling fluid may be used to cool the drill bit 526, as well as to provide lubrication for the drill bit 526 during drilling operations. Additionally, the drilling fluid may be used to remove subsurface formation 514 cuttings created by operating the drill bit 526. It may be the images of these cuttings that many implementations operate to acquire and process.

FIG. 6 is a schematic diagram of an example well system that includes fracturing operations, according to some implementations. A well system 600 may comprise a wellbore 604 in a subsurface formation 606. The wellbore 604 may include a casing 602 and a number of perforations 690A-690G being made in the casing 602 at different depths as part of hydraulic fracturing to allow hydraulic communication between the subsurface formation 606 and the casing 602. The well system 600 also may include a computer system 112 that may be communicatively coupled to a SSTDR apparatus 110 shown in FIG. 1 that may be used for downhole fault detection. The computer system 112 may include memory (machine or computer readable media) and one or more processors, as described in FIG. 4. The well system 600 may include a well electrical cable 115 that may be coupled to the SSTDR apparatus 110 similarly as described above with reference to FIG. 1. Similar to FIG. 1, the well electrical cable 115 may include cable lines, downhole connectors, and well devices. The well electrical cable 115 may provide power and communication capabilities to the well devices. As described in FIG. 1, the SSTDR apparatus 110 may perform SSTDR operations to detect downhole faults in the cable lines, downhole connectors, or the well devices.

While the aspects of the disclosure are described with reference to various implementations and exploitations, it will be understood that these aspects are illustrative and that the scope of the claims is not limited to them. In general, techniques for reservoir modeling as described herein may be implemented with facilities consistent with any hardware system or hardware systems. Many variations, modifications, additions, and improvements are possible.

Plural instances may be provided for components, operations or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the disclosure. In general, structures and functionality presented as separate components in the example configurations may be implemented as a combined structure or component. Similarly, structures and functionality presented as a single component may be implemented as separate components. These and other variations, modifications, additions, and improvements may fall within the scope of the disclosure.

As used herein, the term "or" is inclusive unless otherwise explicitly noted. Thus, the phrase "at least one of A, B, or C" is satisfied by any element from the set {A, B, C} or any combination thereof, including multiples of any element.

EXAMPLE EMBODIMENTS

Example embodiments can include the following:

Embodiment #1: A method for downhole fault detection in a well system, comprising: transmitting a spread spectrum time domain reflectometry (SSTDR) signal downhole via a well electrical cable of the well system; receiving, from the well electrical cable, a reflected SSTDR signal associated with the transmitted SSTDR signal; and determining whether a downhole fault is detected in the well electrical cable or in at least one of a plurality of well devices coupled with the well electrical cable based, at least in part, on a signal analysis of the reflected SSTDR signal and the transmitted SSTDR signal.

Embodiment #2: The method of Embodiment #1, further comprising: in response to detecting a downhole fault in the well electrical cable or in at least one of the plurality of well devices, determining a location of the downhole fault and a type of the downhole fault, wherein the location of the downhole fault includes a depth downhole of the downhole fault.

Embodiment #3: The method of Embodiment #2, wherein the well electrical cable includes cable lines and downhole connectors, further comprising: determining whether the downhole fault is in a section of the cable lines, in at least one of the downhole connectors, or in at least one of the plurality of well devices based, at least in part, on the depth downhole of the downhole fault and the type of the downhole fault.

Embodiment #4: The method of Embodiment #1, further comprising: correlating the reflected SSTDR signal with the transmitted SSTDR signal; and performing the signal analysis based, at least in part, on the correlation of the reflected SSTDR signal with the transmitted SSTDR signal.

Embodiment #5: The method of Embodiment #1, further comprising: performing the signal analysis of the reflected SSTDR signal and the transmitted SSTDR signal using a machine learning algorithm.

Embodiment #6: The method of Embodiment #1, further comprising: performing spread spectrum signal analysis on the reflected SSTDR signal and the transmitted SSTDR signal to determine real-time SSTDR data for the well system; accessing historical SSTDR data for the well system; and determining whether a downhole fault is detected based, at least in part, on the real-time SSTDR data and the historical SSTDR data for the well system.

Embodiment #7: The method of Embodiment #6, further comprising: accessing historical SSTDR data for one or more additional well systems; and determining whether a downhole fault is detected based, at least in part, on the real-time SSTDR data for the well system, the historical SSTDR data for the well system, and the historical SSTDR data for the one or more additional well systems.

Embodiment #8: The method of Embodiment #1, further comprising: detecting a downhole fault in a first well device of the plurality of well devices based, at least in part, on a depth downhole of the downhole fault and a type of the downhole fault; and determining which component of a plurality of components of the first well device is faulty based, at least in part, on the type of the downhole fault and one or more signal signatures detected in at least the reflected SSTDR signal.

Embodiment #9: An apparatus for downhole fault detection in a well system, comprising: one or more processors; and a computer-readable medium having instructions stored thereon that are executable by the one or more processors to cause the apparatus to: transmit an SSTDR signal downhole via a well electrical cable of the well system; receive, from the well electrical cable, a reflected SSTDR signal associated with the transmitted SSTDR signal; and determine whether a downhole fault is detected in the well electrical cable or in at least one of a plurality of well devices coupled with the well electrical cable based, at least in part, on a signal analysis of the reflected SSTDR signal and the transmitted SSTDR signal.

Embodiment #10: The apparatus of Embodiment #9, wherein the instructions further cause the apparatus to: in response to detection of a downhole fault in the well electrical cable or in at least one of the plurality of well devices, determine a location of the downhole fault and a type of the downhole fault, wherein the location of the downhole fault includes a depth downhole of the downhole fault.

Embodiment #11: The apparatus of Embodiment #10, wherein the well electrical cable includes cable lines and downhole connectors, and the instructions further cause the apparatus to: determine whether the downhole fault is in a section of the cable lines, in at least one of the downhole connectors, or in at least one of the plurality of well devices based, at least in part, on the depth downhole of the downhole fault and the type of the downhole fault.

Embodiment #12: The apparatus of Embodiment #9, wherein the instructions further cause the apparatus to: correlate the reflected SSTDR signal with the transmitted SSTDR signal; and perform the signal analysis based, at least in part, on the correlation of the reflected SSTDR signal with the transmitted SSTDR signal.

Embodiment #13: The apparatus of Embodiment #9, wherein the instructions further cause the apparatus to: perform the signal analysis of the reflected SSTDR signal and the transmitted SSTDR signal using a machine learning algorithm.

Embodiment #14: The apparatus of Embodiment #9, wherein the instructions further cause the apparatus to: perform spread spectrum signal analysis on the reflected SSTDR signal and the transmitted SSTDR signal to determine real-time SSTDR data for the well system; access historical SSTDR data for the well system; and determine whether a downhole fault is detected based, at least in part, on the real-time SSTDR data and the historical SSTDR data for the well system.

Embodiment #15: The apparatus of Embodiment #9, wherein the instructions further cause the apparatus to: detect a downhole fault in a first well device of the plurality of well devices based, at least in part, on a depth downhole of the downhole fault and a type of the downhole fault; and determine which component of a plurality of components of the first well device is faulty based, at least in part, on the type of the downhole fault and one or more signal signatures detected in at least the reflected SSTDR signal.

Embodiment #16: A well system for hydrocarbon recovery, comprising: a well electrical cable; a plurality of well devices coupled with the well electrical cable; and an SSTDR apparatus coupled with the well electrical cable, the SSTDR apparatus configured to: transmit an SSTDR signal downhole via a well electrical cable of the well system; receive, from the well electrical cable, a reflected SSTDR signal associated with the transmitted SSTDR signal; and determine whether a downhole fault is detected in the well electrical cable or in at least one of the plurality of well devices based, at least in part, on a signal analysis of the reflected SSTDR signal and the transmitted SSTDR signal.

Embodiment #17: The well system of Embodiment #16, wherein the SSTDR apparatus is further configured to: in response to detection of a downhole fault in the well electrical cable or in at least one of the plurality of well devices, determine a location of the downhole fault and a type of the downhole fault, wherein the location of the downhole fault includes a depth downhole of the downhole fault.

Embodiment #18: The well system of Embodiment #17, wherein the well electrical cable includes cable lines and downhole connectors, and the SSTDR apparatus is further configured to: determine whether the downhole fault is in a section of the cable lines, in at least one of the downhole connectors, or in at least one of the plurality of well devices based, at least in part, on the depth downhole of the downhole fault and the type of the downhole fault.

Embodiment #19: The well system of Embodiment #16, wherein the SSTDR apparatus is further configured to: perform spread spectrum signal analysis on the reflected SSTDR signal and the transmitted SSTDR signal to determine real-time SSTDR data for the well system; access historical SSTDR data for the well system; and determine whether a downhole fault is detected based, at least in part, on the real-time SSTDR data and the historical SSTDR data for the well system.

Embodiment #20: The well system of Embodiment #16, wherein the SSTDR apparatus is further configured to: detect a downhole fault in a first well device of the plurality of well devices based, at least in part, on a depth downhole of the downhole fault and a type of the downhole fault; and determine which component of a plurality of components of the first well device is faulty based, at least in part, on the type of the downhole fault and one or more signal signatures detected in at least the reflected SSTDR signal.

What is claimed is:

1. A method for downhole fault detection in a well system, comprising:
   transmitting a spread spectrum time domain reflectometry (SSTDR) signal downhole via a well electrical cable of the well system, wherein a plurality of well devices are coupled with the well electrical cable and the well electrical cable includes cable lines and downhole connectors;
   receiving, from the well electrical cable, a reflected SSTDR signal associated with the transmitted SSTDR signal;
   detecting a downhole fault and determining a depth downhole of the detected downhole fault and a type of the detected downhole fault based, at least in part, on a signal analysis of the reflected SSTDR signal and the transmitted SSTDR signal; and
   determining whether the detected downhole fault is in at least one section of the cable lines, in at least one of the downhole connectors, or in at least one of the plurality of well devices based, at least in part, on the depth downhole of the detected downhole fault and the type of the detected downhole fault.

2. The method of claim 1, further comprising:
   correlating the reflected SSTDR signal with the transmitted SSTDR signal; and
   performing the signal analysis based, at least in part, on the correlation of the reflected SSTDR signal with the transmitted SSTDR signal.

3. The method of claim 1, further comprising:
   performing the signal analysis of the reflected SSTDR signal and the transmitted SSTDR signal using a machine learning algorithm.

4. The method of claim 1, further comprising:
   performing spread spectrum signal analysis on the reflected SSTDR signal and the transmitted SSTDR signal to determine real-time SSTDR data for the well system;
   accessing historical SSTDR data for the well system; and
   detecting the downhole fault and determining the depth downhole of the detected downhole fault and the type of the detected downhole fault based, at least in part, on the real-time SSTDR data and the historical SSTDR data for the well system.

5. The method of claim 4, further comprising:
   accessing historical SSTDR data for one or more additional well systems; and
   detecting the downhole fault and determining the depth downhole of the detected downhole fault and the type of the detected downhole fault based, at least in part, on the real-time SSTDR data for the well system, the historical SSTDR data for the well system, and the historical SSTDR data for the one or more additional well systems.

6. The method of claim 1, further comprising:
   determining that the detected downhole fault is in a first well device of the plurality of well devices based, at least in part, on the depth downhole of the detected downhole fault and the type of the detected downhole fault; and
   determining which component of a plurality of components of the first well device is faulty based, at least in part, on the type of the detected downhole fault and one or more signal signatures detected in at least the reflected SSTDR signal.

7. An apparatus for downhole fault detection in a well system, comprising:
   one or more processors; and
   a computer-readable medium having instructions stored thereon that are executable by the one or more processors to cause the apparatus to:
      transmit a spread spectrum time domain reflectometry (SSTDR) signal downhole via a well electrical cable of the well system, wherein a plurality of well devices are coupled with the well electrical cable and the well electrical cable includes cable lines and downhole connectors;
      receive, from the well electrical cable, a reflected SSTDR signal associated with the transmitted SSTDR signal;
      detect a downhole fault and determine a depth downhole of the detected downhole fault and a type of the detected downhole fault based, at least in part, on a signal analysis of the reflected SSTDR signal and the transmitted SSTDR signal; and
      determine whether the detected downhole fault is in at least one section of the cable lines, in at least one of the downhole connectors, or in at least one of the plurality of well devices based, at least in part, on the depth downhole of the detected downhole fault and the type of the detected downhole fault.

8. The apparatus of claim 7, wherein the instructions further cause the apparatus to:
   correlate the reflected SSTDR signal with the transmitted SSTDR signal; and
   perform the signal analysis based, at least in part, on the correlation of the reflected SSTDR signal with the transmitted SSTDR signal.

9. The apparatus of claim 7, wherein the instructions further cause the apparatus to:
   perform the signal analysis of the reflected SSTDR signal and the transmitted SSTDR signal using a machine learning algorithm.

10. The apparatus of claim 7, wherein the instructions further cause the apparatus to:
    perform spread spectrum signal analysis on the reflected SSTDR signal and the transmitted SSTDR signal to determine real-time SSTDR data for the well system;
    access historical SSTDR data for the well system; and
    detect the downhole fault and determining the depth downhole of the detected downhole fault and the type of the detected downhole fault based, at least in part, on the real-time SSTDR data and the historical SSTDR data for the well system.

11. The apparatus of claim 7, wherein the instructions further cause the apparatus to:
    determine that the detected downhole fault is in a first well device of the plurality of well devices based, at least in part, on the depth downhole of the detected downhole fault and the type of the detected downhole fault; and
    determine which component of a plurality of components of the first well device is faulty based, at least in part, on the type of the detected downhole fault and one or more signal signatures detected in at least the reflected SSTDR signal.

12. A well system for hydrocarbon recovery, comprising:
    a well electrical cable including cable lines and downhole connectors;
    a plurality of well devices coupled with the well electrical cable; and a spread spectrum time domain reflectometry (SSTDR) apparatus coupled with the well electrical cable, the SSTDR apparatus configured to:
- transmit an SSTDR signal downhole via the well electrical cable of the well system;
- receive, from the well electrical cable, a reflected SSTDR signal associated with the transmitted SSTDR signal;
- detect a downhole fault and determine a depth downhole of the detected downhole fault and a type of the detected downhole fault based, at least in part, on a signal analysis of the reflected SSTDR signal and the transmitted SSTDR signal; and
- determine whether the detected downhole fault is in at least one section of the cable lines, in at least one of the downhole connectors, or in at least one of the plurality of well devices based, at least in part, on the depth downhole of the detected downhole fault and the type of the detected downhole fault.

13. The well system of claim 12, wherein the SSTDR apparatus is further configured to:
- perform spread spectrum signal analysis on the reflected SSTDR signal and the transmitted SSTDR signal to determine real-time SSTDR data for the well system;
- access historical SSTDR data for the well system; and
- detect the downhole fault and determine the depth downhole of the detected downhole fault and the type of the detected downhole fault based, at least in part, on the real-time SSTDR data and the historical SSTDR data for the well system.

14. The well system of claim 12, wherein the SSTDR apparatus is further configured to:
- determine that the detected downhole fault is in a first well device of the plurality of well devices based, at least in part, on the depth downhole of the detected downhole fault and the type of the downhole fault; and
- determine which component of a plurality of components of the first well device is faulty based, at least in part, on the type of the detected downhole fault and one or more signal signatures detected in at least the reflected SSTDR signal.

* * * * *